United States Patent [19]
Hastings et al.

[11] Patent Number: 5,673,172
[45] Date of Patent: Sep. 30, 1997

[54] APPARATUS FOR ELECTROMAGNETIC INTERFERENCE AND ELECTROSTATIC DISCHARGE SHIELDING OF HOT PLUG-CONNECTED HARD DISK DRIVES

[75] Inventors: Robert J. Hastings, Humble; Paily T. Varghese, Tomball; Lowell M. Good, Cypress; Barry S. McAuliffe, Houston, all of Tex.

[73] Assignee: Compaq Computer Corporation, Houston, Tex.

[21] Appl. No.: 583,415

[22] Filed: Jan. 5, 1996

[51] Int. Cl.$^6$ .............................. G06F 1/16; H05K 7/10; H05K 9/00
[52] U.S. Cl. .................................. 361/685; 361/818
[58] Field of Search .............. 364/708.1; 439/928, 439/928.1; 174/35 R, 35 GC; 361/685, 692, 693, 816, 818

[56] References Cited

U.S. PATENT DOCUMENTS

| | | | |
|---|---|---|---|
| 4,821,145 | 4/1989 | Corfits et al. | 361/816 X |
| 5,216,582 | 6/1993 | Russell et al. | 361/685 |
| 5,262,923 | 11/1993 | Batta et al. | 361/685 |
| 5,340,340 | 8/1994 | Hastings et al. | 439/928 X |
| 5,530,202 | 6/1996 | Dais et al. | 361/816 X |

*Primary Examiner*—Michael W. Phillips
*Attorney, Agent, or Firm*—Konneker & Smith

[57] ABSTRACT

A series of hard disk drives are secured atop molded plastic support trays slidably and removably received in opposing guide channel member pairs snap-fitted into opposite side walls of a sheet metal cage structure. Sheet metal electromagnetic interference and electrostatic discharge-suppressing housings enclose each hard disk drive, provide for ventilation of the hard disk drive and any associated electronic components through perforated portions thereof, and prevent transmission of electromagnetic interference through unperforated portions thereof. Each electromagnetic interference and electrostatic discharge-suppressing housing has grounding spring members mounted on a rear portion thereof, and resilient support members between the housing and the grounding spring members.

17 Claims, 4 Drawing Sheets

APPARATUS FOR ELECTROMAGNETIC INTERFERENCE AND ELECTROSTATIC DISCHARGE SHIELDING OF HOT PLUG-CONNECTED HARD DISK DRIVES

CROSS-REFERENCE TO RELATED APPLICATION

This application discloses subject matter similar to that disclosed in U.S. application Ser. No. 08/004,696 filed Jan. 14, 1993 entitled "Apparatus for Removably Supporting a Plurality of Hot Plug-Connected Hard Disk Drives", now U.S. Pat. No. 5,340,340.

BACKGROUND OF THE INVENTION

1. Field of the Invention

The present invention relates generally to hard disk drives for computers, and more particularly relates to apparatus for shielding a plurality of hot plug-connected hard disk drives from electromagnetic interference and electrostatic discharge.

2. Description of Related Art

Hard disk drives for a file server or other computer are often mounted, in a vertically spaced array external to the file server, in a rectangular sheet metal "cage" structure within an external disk drive support housing. For operational convenience and flexibility, each disk drive is typically "hot plug" connected within the support housing. This type of electrical connection permits any of the supported disk drives to be removed and re-installed within the support housing without disturbing the operation of the other disk drives.

Under a conventional practice, each disk drive is mounted atop a printed circuit board having a rear card edge portion which is insertable into a back plane hot plug socket within the cage structure. To install each disk drive within the cage, side edge portions of its supporting printed circuit board are inserted into a pair of track members mounted on opposed side wall portions of the cage and then slid rearwardly along the tracks until the rear card edge portion of the circuit board is operatively received in its associated hot plug socket at the back of the cage.

In the event that a hard disk drive is received in its associated hot plug socket at the same time as another, previously installed, hard disk drive within the cage is in the process of writing data to its disk, an undetectable write error may be recorded on the first disk. This situation can be disastrous, particularly because the write error is undetectable and, therefore, potentially uncorrectable at a later date when the write error is actually detected.

The write error in the installed hard disk drive is caused by the emanation of electromagnetic interference (hereinafter, "EMI") from the hard disk drive which is being inserted into its associated hot plug socket. Where a printed circuit board having EMI-producing electronic components installed thereon is mounted to the hard disk drive which is being installed into the cage, other hard disk drives already installed in the cage also require shielding from the EMI produced by those electronic components.

In addition, undetectable hard disk drive write errors may be caused by electrostatic discharge (hereinafter, "ESD") when a hard disk drive is installed into a cage. Conventionally, relatively small grounding contacts are located at the rear edge of the printed circuit board which forms the plug at the rear of the hard disk drive. Other designs place a similarly small grounding strip along the side edges of the supporting printed circuit board so that contact may be made with a grounding contact mounted to the inside surface of the cage.

Such solutions are inadequate for this ESD situation, because of their small contact area and the fact that the contact is typically made when the plug is inserted into its associated socket, or immediately before. By the time a hard disk drive has been partially inserted into the cage, a high voltage ESD may have already occurred, potentially producing undetectable write errors in those previously installed hard disk drives in the cage which are writing data to their disks.

It can be seen from the foregoing that it would be desirable to provide EMI shielding for hot plug disk drives which protect previously installed hard disk drives from EMI produced when another hard disk drive is subsequently installed. It would also be desirable to provide a means for protecting the previously installed hard disk drives from ESD produced when another hard disk drive is installed. It is accordingly an object of the present invention to provide improved EMI shielding and ESD protection for hot plug-connected hard disk drives.

SUMMARY OF THE INVENTION

In carrying out principles of the present invention, in accordance with a preferred embodiment thereof, apparatus is provided for EMI and ESD shielding of hot plug-connected hard disk drives.

In broad terms, a shield is provided for a disk drive of the type mounted to a support tray for insertion rearwardly into a sheet metal housing having opposing interior sides, the disk drive being susceptible to electromagnetic interference and electrostatic discharge, the shield comprising an enclosure made of an electrically conductive material and having a top portion and opposing side portions, means for mounting the enclosure to the support tray so that the disk drive is enclosed by the enclosure on the support tray, means for electrically coupling the enclosure to the disk drive, and means disposed on a rear portion of an enclosure opposing side portion for grounding the enclosure to the opposing interior sides of the sheet metal housing.

Apparatus for supporting, providing a plug connection, and shielding for a disk drive is also provided, the apparatus comprising a housing cage structure having an open front end, a rear end wall having a plug socket thereon, and first and second opposite side walls extending between the open front end and the rear end wall and having facing surfaces, first and second elongated guide channel members having open side portions and interiors along their lengths, the guide channel members being mounted on the facing surfaces of the first and second side walls in a parallel relationship in which the open side portions of the mounted first and second guide channel members face one another and the first and second guide channel members longitudinally extend toward the plug socket in a generally laterally aligned relationship therewith, a support tray member having opposite side edge portions slidably and supportingly receivable in the interiors of the first and second guide channel members in a manner permitting the support tray member to be slid rearwardly along the first and second guide channel members to bring the support tray member to an operating position within the cage structure, the support tray member having a rear end portion and a top side portion disposed forwardly of the rear end portion, a plug circuit board mounted on the rear end portion of the support tray member for movement therewith in a manner such that when the support tray member is rearwardly moved through the cage structure to the operating position a rear portion of the mounted plug circuit board is conductively and removably received within the plug socket, means for removably securing a disk drive to the top side portion of the support tray member for movement therewith, means for electrically coupling the plug circuit board to the disk drive, a conductive cover having a top portion and side portions, the cover being disposed on the support tray member covering the disk drive, and two sheet metal grounding spring members, each of the sheet metal grounding spring members being mounted to a rear portion of one of the conductive cover side portions such that when the support tray member is slid rearwardly along the first and second guide channel members the sheet metal grounding spring members electrically couple to the housing cage structure facing surfaces.

DETAILED DESCRIPTION

Figure 1:
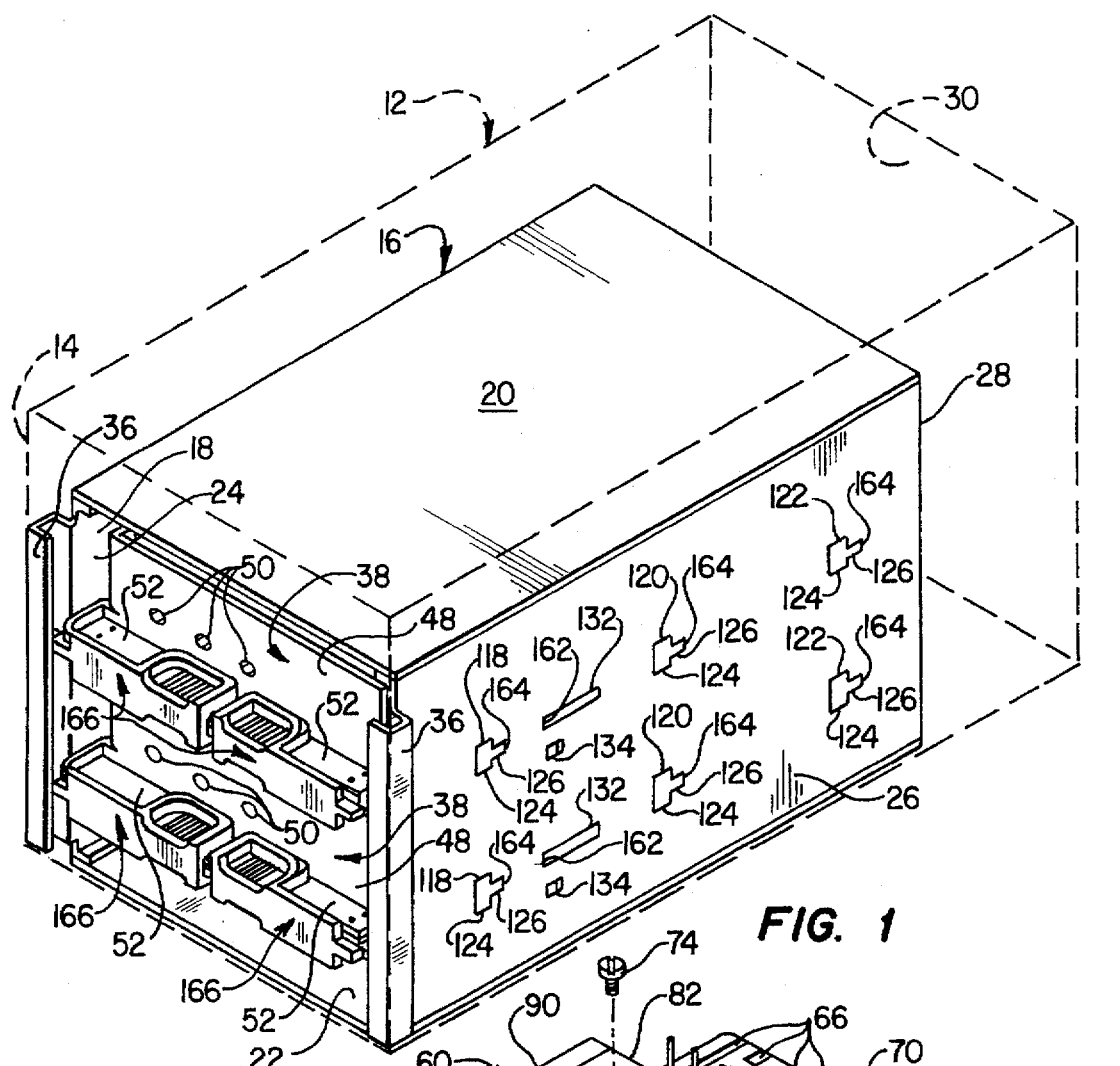
FIG. 1 is a partially phantomed, simplified perspective view of a representative external, hot-plug connection hard disk drive support housing structure embodying principles of the present invention.
Figure 2:
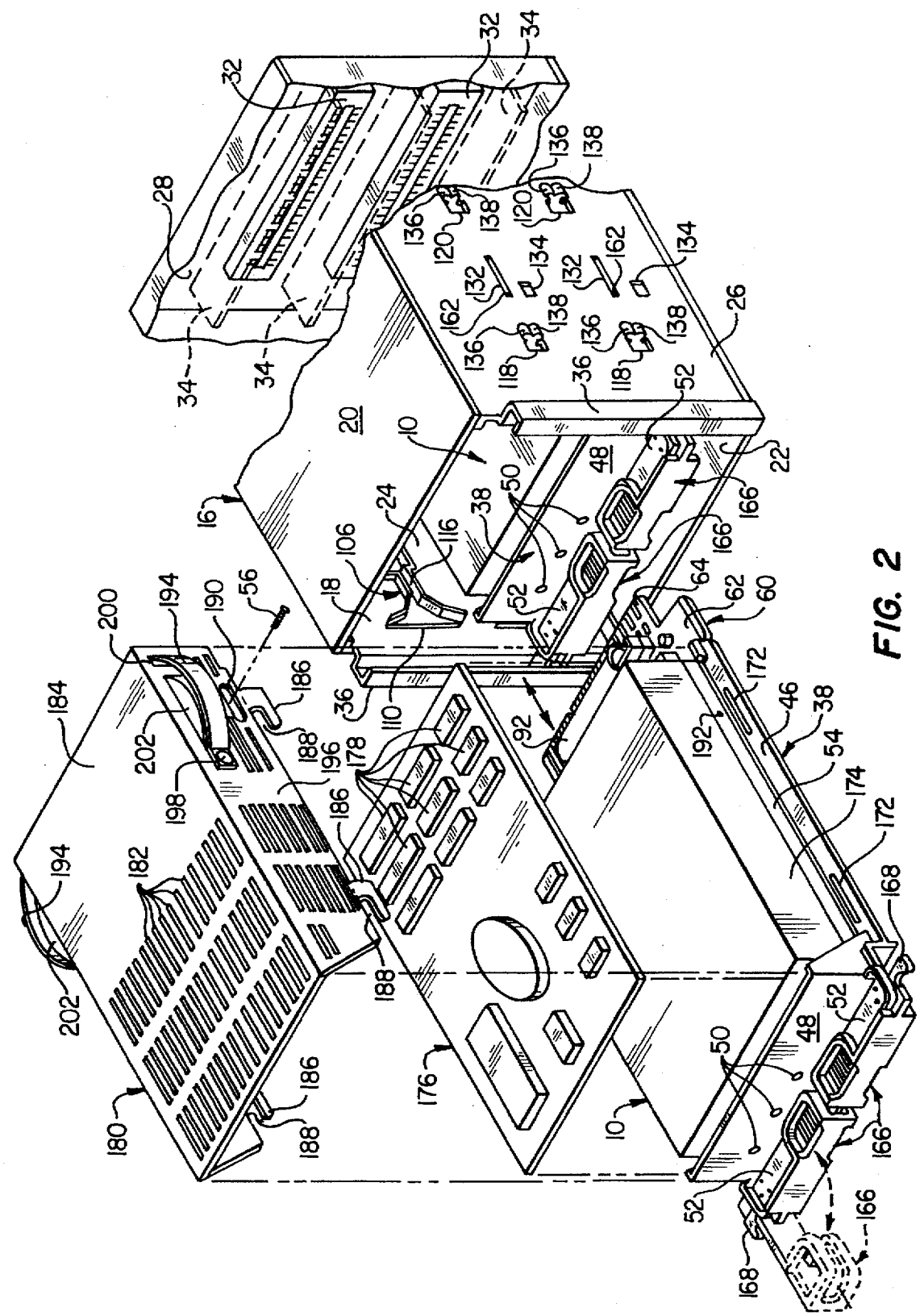
FIG. 2 is an enlarged scale, partially exploded fragmentary perspective view of an interior sheet metal cage portion of the housing, with one of the tray-supported disk drives, and its associated drive circuit board and shield, removed therefrom.

Referring initially to FIGS. 1 and 2 of the drawings, in a preferred embodiment thereof the present invention provides EMI and ESD shielding apparatus for a vertically spaced plurality of disk drives 10 (FIG. 2) such as those externally utilized in conjunction with a file server (not shown) or other computer device. The disk drives 10 are configured in a support apparatus. The support apparatus representatively includes a generally rectangular housing 12 having an open front end 14, and a generally rectangular sheet metal cage structure 16 disposed within the housing.

Cage 16 has an open front end 18 rearwardly adjacent the housing front end 14, top and bottom walls 20 and 22, left and right side walls 24 and 26, and a rear end wall 28 spaced inwardly apart from the rear end wall 30 of housing 12. A vertically spaced pair of horizontally elongated hot plug sockets 32 are mounted on the rear cage end wall 28 (FIG. 2).

Three vertically spaced, horizontally elongated rectangular guard plate members 34 project forwardly beyond the rear cage end wall 28, with each of the sockets 32 being disposed between and parallel to a vertically adjacent pair of the plates 34. Front end portions of the cage side walls 24,26 are bent to form a pair of vertically extending wall channel portions 36 having generally U-shaped cross-sections along their lengths, and horizontally facing open sides.

Referring now to FIGS. 1–4, each of =the disk drives 10 is supported on the top side of one of a specially designed pair of molded plastic support trays 38 each having a generally rectangular body 40. Support trays 38 are similar to those illustrated and described in the aforementioned U.S. Pat. No. 5,340,340. Body 40 has a series of cooling holes 42 formed therethrough; a rear end portion 44 (see FIG. 4); a pair of outwardly projecting opposite side edges 46 rearwardly terminating at rear end portion 44; an upwardly projecting front end plate portion 48 with three LED disk drive activity indicating lights 50 mounted thereon; longitudinal slots 172; and a pair of opposite front corner portions 52 projecting outwardly beyond the lower side edge of the front end plate 48. Rotatably mounted to each corner portion 52 is a latch mechanism 166 with outwardly extending projection 168 for releasably engaging the wall channel portions 36 on each side of the support trays 38.

Each disk drive 10 is of a conventional construction and has a pair of mounting rail sections 54 extending forwardly and rearwardly along opposite lower side portions thereof. The mounting rail sections 54 are electrically grounded to the disk drive 10.

When each disk drive 10 is operatively mounted atop the body portion 40 of its associated support tray 38, the disk drive is positioned between the plate 48 and the rear end portion 44 of the tray body. Each disk drive 10 is removably secured to its associated support tray 38 by screws 58 extending upwardly through the tray body and threaded into the bottom side of the disk drive.

The disk drive 10 representatively illustrated in FIG. 2 is of a relatively large configuration 174. A separate drive circuit board 176 is positioned atop the large configuration disk drive 174 and structurally and electrically interconnected thereto in a conventional manner. Mounted on the drive circuit board 176 are a plurality of EMI-emitting electrical components 178.

To shield other disk drives 10 from the EMI given off by the EMI-emitting components 178 on the drive circuit board 176, a sheet metal EMI shield 180 is installed over the circuit board 176 and large configuration disk drive 174. The shield 180 has perforations 182 therethrough to provide ventilation for the circuit board 176, but no perforations are present in the area 184 which overlies the EMI-emitting components 178.

The shield 180 is secured to the support tray 38 with tabs 186 which are inserted into the slots 172. The shield 180 is then slid forward so that the tabs 186 engage the support tray 38 in recesses 188. A pair of grounding screws 56 are then installed through holes 190 in the shield 180 and into threaded holes 192 in the mounting rail sections 54. The shield 180 is thus electrically grounded to the disk drive 174.

To accomplish adequate grounding of the shield 180 to the cage 16, a pair of relatively wide, large contact area metal grounding springs 194 are attached to the shield. The grounding springs 194 extend through a pair of openings 200 and are mounted to sides 196 of the shield 180 with rivets 198. The grounding springs 194 are biased so that they will contact the sides 24,26 of the cage 16 when the support tray 38 is installed in the cage. A resilient bumper 202 between each grounding spring 194 and shield side 196 prevent the springs from being inadvertently collapsed.

The grounding springs 194 are mounted rearwardly on the shield 180 so that it is grounded to the cage 16 as soon as the shield is inserted into the cage and remains so grounded until it is completely removed therefrom. In this manner the shield 180 also provides ESD protection for the disk drives 10 in the cage 16.

Figure 3:
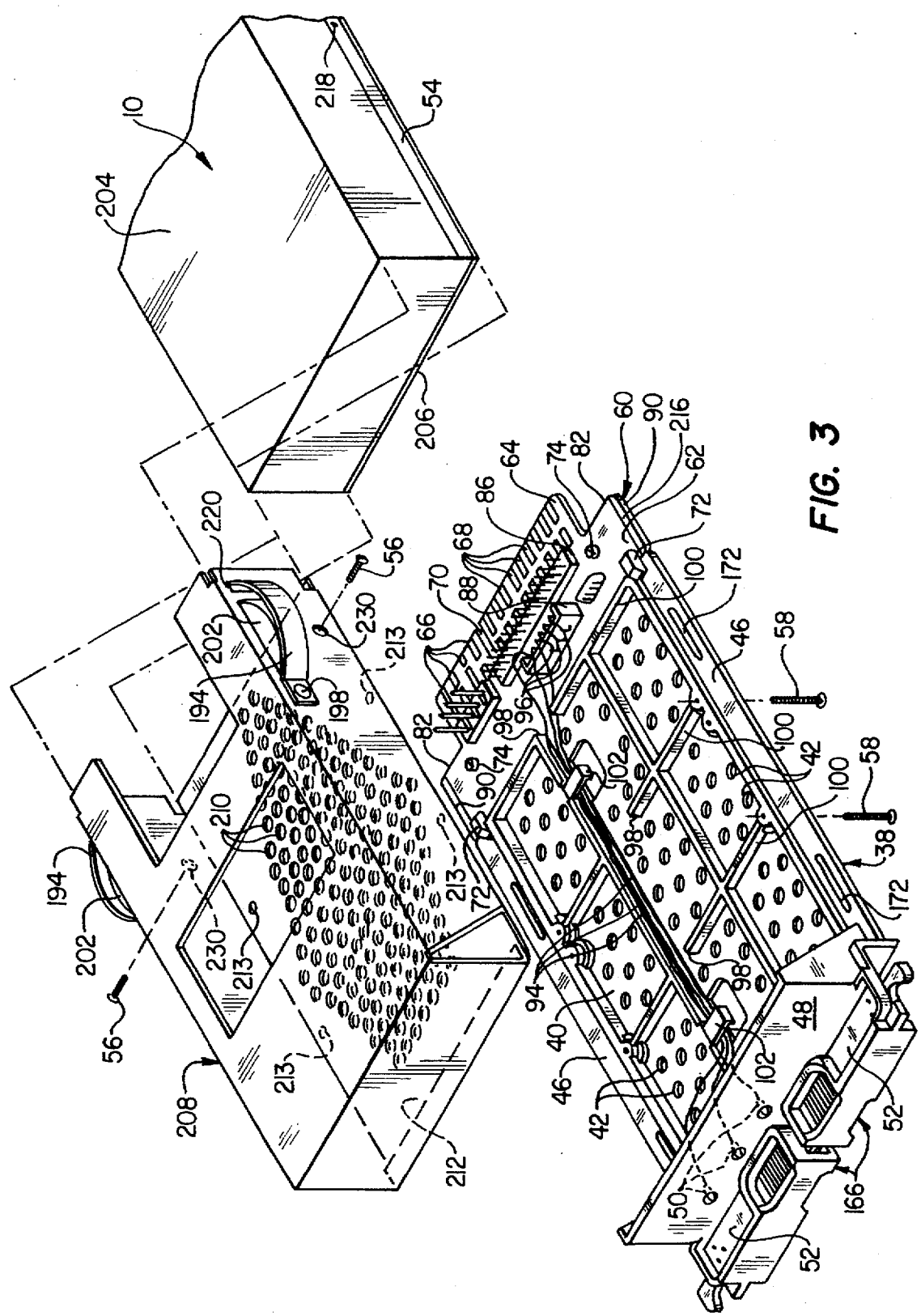
FIG. 3 is an enlarged scale partially exploded perspective view of another, relatively smaller disk drive and its associated shield and underlying support tray structure.

The disk drive 10 representatively illustrated in FIG. 3 is also of conventional design, but is in a relatively smaller configuration than the disk drive 174 illustrated in FIG. 2. As shown in FIG. 3, the small configuration disk drive 204 has its associated drive circuit board 206 mounted on its bottom side. The circuit board 206 is electrically and structurally interconnected to the disk drive 204 in a conventional manner.

A sheet metal EMI shield 208, with perforations 210 extending through its bottom side 212 to provide ventilation for the circuit board 206, encloses the disk drive 204 and its integral circuit board 206 prior to the disk drive 204 being secured to the tray 38 with screws 58 as described above. In this case, the screws 58 pass through corresponding holes in the tray 38, and through holes 213 in the bottom side 212 of the EMI shield 208 before being threaded into the disk drive 204. Screws 58 thus ground the shield 208 to the disk drive 204.

Grounding of the EMI shield 208 to the disk drive 204 illustrated in FIG. 3 is accomplished in a manner similar to that representatively illustrated for the disk drive 174 illustrated in FIG. 2. A pair of grounding screws 56 are installed through grounding holes 230 in the EMI shield 208 and into threaded holes 218 in the mounting rail sections 54. The shield 208 is thus electrically grounded to the disk drive 204.

For adequate grounding of the shield 208 to the cage 16, a pair of metal grounding springs 194 are attached to the shield 208 as similarly described above for the shield 108 representatively illustrated in FIG. 2. The grounding springs 194 extend through a pair of openings 220 and are mounted to sides 222 of the shield 208 with rivets 198. The grounding springs 194 are biased so that they will contact the sides 24,26 of the cage 16 when the support tray 38 is installed in the cage. A resilient bumper 202 between each grounding spring 194 and shield side 222 prevent the springs from being inadvertently collapsed.

The grounding springs 194 are mounted rearwardly on the shield 208 so that it is grounded to the cage 16 as soon as the shield is inserted into the cage and until it is completely removed therefrom. In this manner the shield 208 provides ESD protection for the disk drives 10 in the cage 16 as described above for the shield 180 provided for the large configuration disk drive 174.

Thus, the shields 180,208 described above provide several forms of protection for the disk drives 10 used with the file server. Where more than one disk drive 10 is to be used in the cage 16, one disk drive 10 is protected from the EMI produced by EMI-emitting components 178 (see FIG. 3) associated with another disk drive 10 by the unperforated area 184 on the shield 180 enclosing the circuit board 176 containing the EMI-emitting components. Additionally, the sheet metal shields 180,208, being grounded to the cage 16 via wide grounding springs 194 having large surface contact areas, also provide a measure of protection from EMI entering the shields 180,208. Therefore, if more than one disk drive 10 is installed in the cage 16, and each disk drive 10 has a shield 180 or 208 operatively installed thereon, and one of the disk drives 10 is writing data, then the disk drive writing data is protected from EMI by both the shield or shields 180 or 208 installed over the other disk drive or drives, as well as by the shield 180 or 208 over the disk drive writing data.

Protection from ESD is provided for a disk drive 10 writing data by both the shield 180 or 208 operatively installed thereon and the shield 180 or 208 operatively installed on a disk drive 10 being installed into the cage 16. The shield 180 or 208 enclosing the disk drive 10 writing data provides ESD protection by grounding that disk drive to the cage 16 via the large contact area grounding springs 194. The shield 180 or 208 enclosing a disk drive 10 being installed into the cage 16 provides ESD protection for a previously installed disk drive 10 by grounding the disk drive 10 being installed to the cage 16 immediately upon entering the opening 18, due to the grounding springs 194 being mounted rearwardly on the shield 180 or 208, thus dissipating any ESD before the disk drive 10 being installed comes in close proximity to the previously installed disk drive 10 or hot plug sockets 32.

Mounted atop the rear end portion 44 of each support tray 38 is a small printed circuit board 60 having an elongated rectangular body portion 62 from which a somewhat shorter rectangular plug portion 64 centrally projects in a rearward direction. Plug portion 64 has formed on its top side a series of forwardly and rearwardly extending electrically conductive surface traces including grounding traces 66 and signal traces 68. For purposes later described, the grounding traces 66 extend rearwardly beyond the signal traces 68. A slot 70, parallel to the traces 66 and 68, is formed in the circuit board plug portion 64 and functions in a conventional manner to assure the proper orientation of the plug portion when it is operatively inserted into one of the hot plug sockets 32 as later described.

Figure 4:
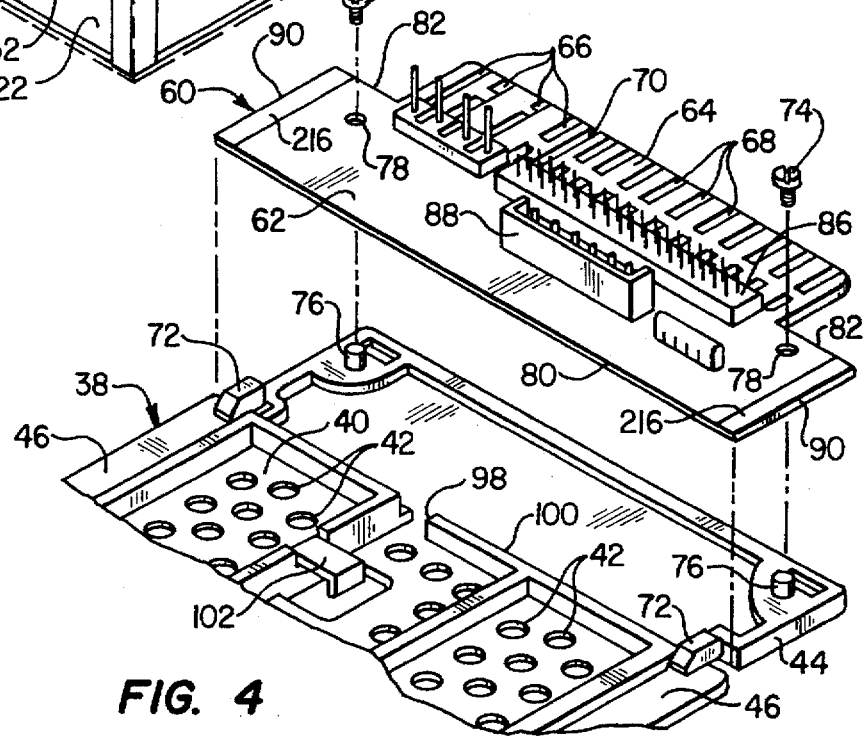
FIG. 4 is an exploded perspective view of a rear end portion of the support tray structure illustrating the snap-fit installation thereon of a plug circuit board connector member.

With reference now to FIG. 4, each circuit board body portion 62 is releasably fitted onto the top of its associated rear support tray end portion 44 by means of a pair of abutment tabs 72 formed on opposite sides of the tray body 40; a pair of upwardly projecting hollow cylindrical post portions 76 formed on the rear tray end portion 44; and a pair of circular holes 78 formed through the circuit board body 62.

As may be seen by comparing FIGS. 3 and 4, the circuit board 60 is removably installed on the rear support tray end portion 44 by inserting a front side edge portion 80 of the circuit board body under the abutment tabs 72 and then downwardly pivoting the circuit board 60 to cause the posts 76 to upwardly enter the circuit board body holes 78. Fasteners 74 are installed in post portions 76, downwardly securing the circuit board body 62 onto posts 76.

With the circuit board 60 releasably mounted on the support tray 38 in this manner, the posts 76 preclude edgewise movement of the circuit board relative to the support tray so that the posts 76 resist in shear the insertion and removal loads imposed on the circuit board as its plug portion 64 is pushed into and pulled out of its associated hot plug socket 32 as later described.

As best illustrated in FIG. 3, with the circuit board 60 mounted on the support tray 38, opposite end edge portions 90 of the circuit board body 62 define rearward continuations of the side edge portions 46 of the support tray 38. To provide for operative wiring interconnections between the circuit board 60, the disk drive 10, and the indicating lights 50, various connector pin sections, such as the illustrated pin sections 86 and 88, are mounted on the circuit board body 62.

Pin section 86 is operatively connected to the rear end of the mounted disk drive 10 by a conventional ribbon cable 92, pin section 88 is operatively connected to the indicating lights 50 by wires 94 (see FIG. 3), and pin section 88 is operatively connected to the underside of the disk drive 10 by wires 96. The wires 94,96 are conveniently routed to the indicating lights 50 and the underside of the disk drive 10 through a wire passage disposed on the top side of the support tray body 40 and generally defined by notches 98 formed in transverse stiffening rib portions 100 of the support tray body, and holding tab portions 102 that overlie the routed wiring.

Figure 5:
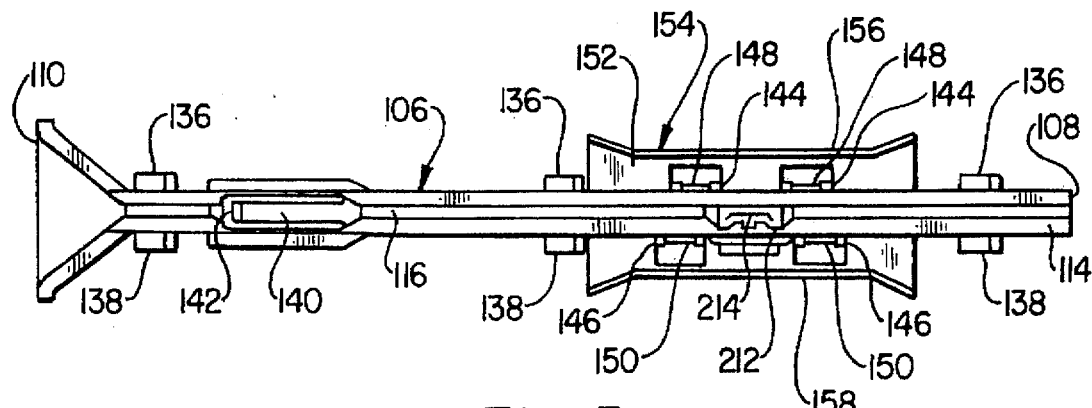
FIG. 5 is an outer side elevational view of a specially designed support rail structure used to slidably carry the disk drives within the cage.
Figure 6:
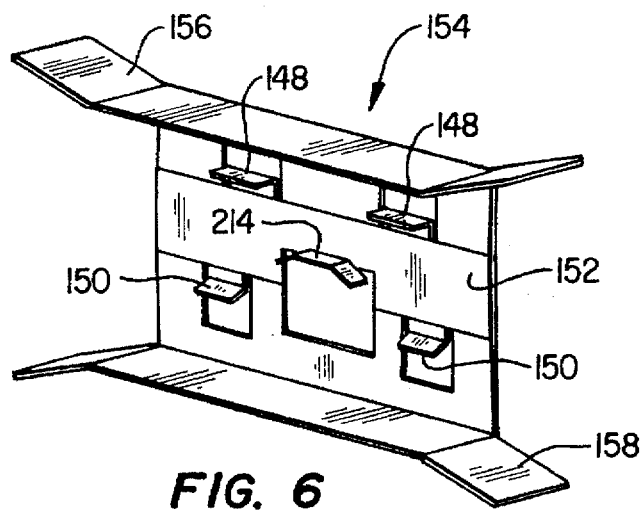
FIG. 6 is an enlarged scale perspective view of a grounding clip portion of the support rail structure of FIG. 5.

Referring now to FIGS. 2, 5 and 6, the support trays 38 are slidably and removably mounted within the cage structure 16 by means of four molded plastic guide channel members 106, one of which is visible in FIG. 2 and illustrated in FIG. 5. Each guide channel member 106 has an elongated configuration; a rear end 108; a transversely enlarged front end 110; an outer side (not shown); an inner side 114; and a generally U-shaped cross-section along its length. The cross-sectional configuration of each guide channel member 106 defines therein a longitudinally extending channel or track 116 that laterally opens through the inner side 114 of the member and vertically widens at the front end of the member to facilitate the slidable insertion therein of a circuit board end edge portion as later described.

The four guide channel members 106 are arranged in an upper pair removably secured in a parallel, laterally opposing relationship to the inner sides of the cage side walls 24 and 26, and a lower pair removably secured in a parallel, laterally opposing relationship to the inner sides of the cage side walls 24 and 26. Guide channel members 106 are releasably snap-fitted onto the cage side walls 24,26 using upper and lower horizontal rows of generally T-shaped openings 118,120,122 formed in each of the cage side walls 24 and 26 (see FIGS. 1 and 2).

As best illustrated in FIG. 1, each of the side wall openings 118,120,122 has a vertically enlarged front end portion 124, and a rear end portion 126 that is vertically narrowed. For purposes later described, horizontally elongated rectangular openings 132 are formed in the cage side walls 24,26 between each pair of openings 118 and 120, and inturned side wall tab portions 134 are positioned beneath the front ends of the openings 132.

Referring now to FIG. 5, formed on the outer side of each of the guide channel members 106, and projecting outwardly therefrom, are three longitudinally spaced pairs of upwardly and downwardly extending holding tabs 136 and 138. Between the front two sets of tabs 136,138 the guide channel member has formed thereon a horizontally elongated, inwardly deflectable resilient latch portion 140 laterally projecting outwardly beyond the outer side surface of the guide channel member and having a front end surface 142.

Between its rear two pairs of tabs 136,138 each guide channel member 106 has two longitudinally spaced pairs 144,146 of ribbed outward projections formed on its top and bottom side edge surfaces. These projections have removably snap-fitted thereon clip member pairs 148,150 projecting inwardly from the outwardly bowed body portion 152 of a resiliently deformable sheet metal grounding clip member 154 positioned on the outer side of the guide channel member as illustrated in FIG. 5. Projecting inwardly from the top and bottom side edges of the grounding clip member 154, and respectively overlying the top and bottom side edges of the guide channel member 106, are top and bottom side portions 156 and 158. As illustrated, side portion 156 has upturned front and rear ends, and side portion 158 has downturned front and rear ends. Grounding Clip 154 also has a central projection 214 having downturned front and rear end portions.

As representatively illustrated in FIG. 2, each guide channel member 106 is removably snap-fitted onto its associated cage side wall (for example, the illustrated right cage side wall 26) by first outwardly inserting the three tab pairs 136,138 into the enlarged front portions 124 of the side wall openings 118,120,122, and pressing the guide channel member against the interior surface of the cage side wall. This initial insertion and pressing causes the latch portion 140 to be engaged and inwardly depressed by the side wall 26, and also resiliently bends the clip member body portion 152 against the side wall 26.

With the guide channel member 106 pressed against the cage side wall, the guide channel member is then rearwardly slid along the side wall until the latch portion 140 snaps outwardly into the side wall opening 132. This releasably locks the guide channel member in place on the cage side wall, the front end surface 142 of the latch portion 140 rearwardly overlying a front end surface 162 of the side wall opening 132 and preventing forward movement of the guide channel member relative to the cage 16, and the rear edge portions of the tab pairs 136,138 abutting rear end surfaces 164 of the side wall opening portions 126 and preventing rearward movement of the guide channel member relative to the cage.

Each guide channel member 106 may be quickly removed from the cage 16 simply by depressing the latch portion 140 from the outside of the cage, forwardly sliding the guide channel member along the inner surface of its associated cage side wall, and then removing the tab pairs 136,138 from the front end portions 124 of the side wall openings 118,120 and 122.

With the two horizontally opposed pairs of guide channel members 106 operatively installed on the inner sides of the cage side walls 24,26 as described above, the two tray-mounted disk drives 10 may simply be pushed into place within the cage 16 by inserting opposite end edge portions of the circuit board body portions 62 into the track portions of the upper and lower opposing guide channel member pairs and rearwardly sliding the circuit board and tray edge portions 46 along the tracks until the circuit board plug portions 64 are operatively hot-plugged into their associated sockets 32 at the rear end of the cage 16. Either of the disk drives 10 may be removed from the cage 16, without disturbing the operation of the other disk drive, by simply pulling the disk drive rearwardly out of the cage.

For reasons subsequently described, in the guide channel member 106 an opening 212 is formed through the plastic body portion of the guide channel member 106 and extends through its track 116 between the lower projections 146. As illustrated in FIG. 5, the opening 212 has a lower side portion that is recessed into the lower side boundary wall of the track 116.

When the grounding clip member 154 is snapped into place on the plastic body of guide channel member 106, the upper clip projections 148 snap into the upper body projections 144, the lower clip projections 150 snap into the lower body projections 146, and the central clip projection 214 is received in the body opening 212 and extends across the track 116.

Figure 7:
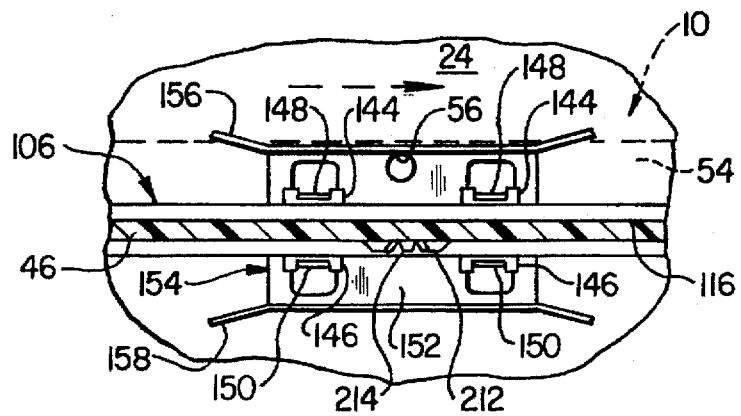
FIG. 7 is a schematic cross-sectional view through one of the support tray structures illustrating the operation of a grounding clip portion of one of its associated support rail structures.

Referring now to FIG. 7, the opposite ends of the body portion 62 of the printed circuit board 60 have rectangular solder pads 216 formed on their top and bottom sides (see FIG. 4). As the support tray 38 is operatively slid into the cage 16, the ends of the printed circuit board body portion 62 slide rearwardly through the tracks 116 of its associated pair of guide channel members 106. Solder pads 216 contact tracks 116 as the support tray 38 is slid rearwardly into the cage 16, thereby electrostatically discharging the circuit board 60 and the disk drive electronics if the guide channel members 106 are made of electrically conductive material. As the opposite ends of the circuit board body portion 62 reach the central clip projection 214, the solder pads 216 on the lower sides of these opposite ends slide across the top sides of the central projections 214, thereby electrostatically discharging the circuit board 60 and the disk drive electronics. The solder pads then rearwardly pass, and become disengaged from the central clip member projection 214. When the disk drive is later removed from the cage 16, the solder pads 216 again wipe across the central clip member projection 214 (and track 116, if made of electrically conductive material) to electrostatically discharge the circuit board 60 and the disk drive electronics.

As each of the support trays 38 rearwardly reaches its operating position within the cage 16, the grounding screws 56 projecting outwardly from opposite sides of the shield 180 or 208 slide under and upwardly engage the upper side portions 156 of the resilient sheet metal grounding clips 154 on the two guide channel members 106 that slidingly support the inserted support tray 38. This engagement between the grounding screws 56 and the upper grounding clip side portions 156 forms additional electrical grounding connections between the disk drive 10, the shield 180 or 208, and the metal cage structure 16 via the grounding screws and the grounding clips. It should be noted that if the guide channel member 106 shown in FIG. 7 was installed on cage side wall 26 instead of the illustrated cage wall 24, the clip member side portion 158, and not the side portion 156, would be engaged by one of the grounding screws 56.

In addition to their electrical grounding function, the two metal grounding screws 56 attached to the opposite sides of each of the disk drives 10 provide another useful function in the overall disk drive support apparatus of the present invention—they cooperate with the inturned cage side wall projections 134 (FIGS. 1 and 2) to prevent the full rearward insertion of either disk drive into the cage 16 in the event that the disk drive is in an improper upside-down orientation. Specifically, if either disk drive is turned upside-down and then inserted into the cage 16, the two grounding screws 56 strike and are rearwardly stopped by an associated opposing pair of the inturned side wall portions 134, thereby preventing further rearward insertion of the improperly oriented disk drive into the cage 16. In turn, this prevents the circuit board 60 from improperly engaging its associated hot plug socket 32.

While the disk drive EMI and ESD shielding apparatus representatively described above provides protected hot plug connections for the disk drives 10, it will readily be appreciated by those skilled in this art that it could also be employed using non-hot plug socket connections for the disk drives if desired.

The foregoing detailed description is to be clearly understood as being given by way of illustration and example only, the spirit and scope of the present invention being limited solely by the appended claims.

What is claimed is:

1. A shield for a disk drive of a type mountable on a support tray for insertion rearwardly into a sheet metal housing having opposing interior sides, the disk drive being susceptible to electromagnetic interference and electrostatic discharge from a source external thereto, the shield comprising:

an enclosure made of an electrically conductive material and having a top portion and opposing side portions;

means for mounting said enclosure to the support tray so that the disk drive is enclosed by said enclosure on the support tray;

means for electrically coupling said enclosure to the disk drive; and means disposed on a rear portion of one of said enclosure opposing side portions for grounding said enclosure to the opposing interior sides of the sheet metal housing, whereby the disk drive is electrically coupled and thereby grounded to the sheet metal housing when the support tray is inserted rearwardly into the sheet metal housing and is protected from the electromagnetic interference and electrostatic discharge.

2. The shield of claim 1, wherein the disk drive further has a drive circuit board mounted thereon, and said enclosure has a plurality of perforations therethrough for ventilation of the drive circuit board.

3. The shield of claim 1, wherein said mounting means comprises:

a plurality of slots formed in the support tray and extending therethrough; and a corresponding plurality of downwardly extending tabs formed on bottom edges of said enclosure opposing side portions, said tabs being insertable into said support tray slots, the disk drive being disposable on the support tray intermediate said enclosure opposing side portions.

4. The shield of claim 1, wherein said mounting means comprises a bottom portion on said enclosure, said bottom portion being disposed intermediate the disk drive and the support tray when the disk drive is mounted to the support tray, whereby the disk drive is enclosed within said enclosure top, opposing side, and bottom portions when the disk drive is mounted to the support tray.

5. The shield of claim 1, wherein said electrically coupling means comprises:

a mounting rail on the disk drive, said mounting rail being electrically coupled to the disk drive;

an aperture formed through said enclosure and positionable proximate said mounting rail; and an electrically conductive fastener, said fastener being installed through said aperture and fastenable to said mounting rail.

6. The shield of claim 1, wherein said grounding means comprises a sheet metal spring member resiliently outwardly biased to conductively contact one of the interior sides of the sheet metal housing when the support tray is inserted rearwardly into the sheet metal housing.

7. Apparatus for shielding a first disk drive from electromagnetic radiation radiating from an area on a second disk drive, the first and second disk drives being installed in a sheet metal cage structure, the sheet metal cage structure being conductively attached to earth ground, the apparatus comprising:

a housing for enclosing the second disk drive, said housing being made of an electrically conductive material and having perforated and unperforated portions, said unperforated portion overlying the area on the second disk drive from which the electromagnetic radiation originates when the second disk drive is enclosed by the housing;

means for electrically coupling said housing to the second disk drive; and means for dissipating the electromagnetic radiation to earth ground.

8. The apparatus according to claim 7, wherein the second disk drive has an associated drive circuit board mounted thereon, the drive circuit board having a component which produces the electromagnetic radiation, and said unperforated portion of said housing overlies the component on the drive circuit board when the second disk chive is enclosed by the housing.

9. The apparatus according to claim 7, wherein said means for dissipating the electromagnetic radiation comprises an elongated strip of sheet metal, said sheet metal strip being conductively mounted to said housing, extending outwardly away from said housing, and capable of contacting the sheet metal cage structure, whereby electromagnetic radiation present in said housing may be dissipated to earth ground at the sheet metal cage structure via said sheet metal strip.

10. The apparatus according to claim 9, further comprising means for biasing said sheet metal strip outwardly from said housing such that the resulting biasing force forces said sheet metal strip to contact the sheet metal cage structure when said sheet metal strip contacts the sheet metal cage structure.

11. The apparatus according to claim 9, wherein said means for dissipating the electromagnetic radiation further comprises a conductive fastener having a head portion, said fastener being securable to the second disk drive such that said head portion extends outwardly therefrom, and a conductive clip member mounted to an interior surface of the sheet metal cage structure such that when the second disk drive is operatively installed in the sheet metal cage structure said fastener head portion conductively contacts said clip member.

12. A shield to protect a first disk drive previously installed in a sheet metal housing from an electrostatic discharge produced when a second disk drive having static electricity thereon is initially being inserted rearwardly into the sheet metal housing adjacent the first disk drive, the shield comprising:

first means for surrounding the first disk drive with conductive material;

second means for surrounding the second disk drive with conductive material;

means for conducting the static electricity from the second disk drive to said second conductive material surrounding means;

means for electrically coupling said first conductive material surrounding means to the sheet metal housing;

means for electrically coupling said first conductive material surrounding means to the first disk drive; and means mounted on a rear portion of said second conductive material surrounding means for conducting the static electricity from said second conductive material surrounding means to the sheet metal housing, whereby when said rear portion of said second conductive material surrounding means is initially inserted into the sheet metal housing the static electricity is conducted to the sheet metal housing via said conducting means mounted on a rear portion of said second conductive material surrounding means and not to the first disk drive which is protected by said first conductive material surrounding means from the electrostatic discharge.

13. The shield according to claim 12, wherein said first and second means for surrounding the first and second disk drives with conductive material each comprise a sheet metal enclosure for substantially covering the outer surfaces of the first and second disk drives, respectively.

14. The shield according to claim 12, wherein said means for conducting the static electricity from said second conductive material surrounding means to the sheet metal housing comprises a spring member made of a conductive material, said spring member being conductively fastened to, and biased outwardly from, a rear portion of said second conductive material surrounding means so that said spring member engages the sheet metal housing when the second disk drive is initially inserted into the sheet metal housing.

15. Apparatus for supporting, providing a plug connection for, and shielding a disk drive, the apparatus comprising:

a housing cage structure having an open front end, a rear end wall having a plug socket thereon, and first and second opposite side walls extending between said open front end and said rear end wall and having facing surfaces;

first and second elongated guide channel members having open side portions and interiors along their lengths, said guide channel members being mounted on said facing surfaces of said first and second side walls in a parallel relationship in which said open side portions of the mounted first and second guide channel members face one another and said first and second guide channel members longitudinally extend toward said plug socket in a generally laterally aligned relationship therewith;

a support tray member having opposite side edge portions slidably and supportingly receivable in the interiors of said first and second guide channel members in a manner permitting said support tray member to be slid rearwardly along said first and second guide channel members to bring said support tray member to an operating position within said cage structure, said support tray member having a rear end portion and a top side portion disposed forwardly of said rear end portion;

a plug circuit board mounted on said rear end portion of said support tray member for movement therewith in a manner such that when said support tray member is rearwardly moved through said cage structure to said operating position a rear portion of the mounted plug circuit board is conductively and removably received within said plug socket;

means for securing a disk drive to said top side portion of said support tray member for movement therewith;

means for electrically coupling said plug circuit board to the disk drive;

a conductive cover having a top portion and side portions, said cover being disposed on said support tray member for covering the disk drive;

two sheet metal grounding spring members, each of said sheet metal grounding spring members being mounted to a rear portion of one of said conductive cover side portions such that when said support tray member is slid rearwardly along said first and second guide channel members said sheet metal grounding spring members electrically couple to said housing cage structure facing surfaces;

sheet metal grounding clip members carried by said guide channel members and deformingly pressed against said first and second side walls of said housing cage structure; and cooperatively engageable means on said conductive cover for grounding the disk drive as said support tray member is being moved through said cage structure toward and away from said operating position.

16. The apparatus of claim 15 wherein:

said cooperatively engageable means comprises metal grounding members secured to and projecting outwardly beyond opposite side portions of said conductive cover, said metal grounding members being configured and positioned to releasably engage said grounding clip members when said support tray member is rearwardly brought to said operating position thereof within said housing cage structure to thereby continuously ground the disk drive while said plug circuit board is operatively connected to said plug socket.

17. The apparatus of claim 16 wherein:

said plug circuit board further comprises a conductive trace adjacent an edge portion thereof, whereby, when said support tray member is slid rearwardly to said operating position within said cage structure, said conductive trace conductively contacts at least one of said sheet metal grounding clip members.

* * * * *